United States Patent
Park

(10) Patent No.: US 6,721,228 B2
(45) Date of Patent: Apr. 13, 2004

(54) SEMICONDUCTOR MEMORY DEVICE USING A PROTOCOL TRANSMISSION METHOD

(75) Inventor: Nak Kyu Park, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 10/159,349

(22) Filed: May 31, 2002

(65) Prior Publication Data

US 2003/0053364 A1 Mar. 20, 2003

(30) Foreign Application Priority Data

Sep. 20, 2001 (KR) .......................... 2001-58144

(51) Int. Cl.[7] ................................. G11C 8/00
(52) U.S. Cl. .................... 365/230.03; 711/105; 711/111
(58) Field of Search ........... 365/230.03, 189.03, 365/51; 711/105, 111, 100

(56) References Cited

U.S. PATENT DOCUMENTS

| | | | |
|---|---|---|---|
| 4,660,078 A | 4/1987 | Riolfo et al. | |
| 5,165,087 A | 11/1992 | Schwee | |
| 6,219,292 B1 | 4/2001 | Jang | |
| 6,370,668 B1 * | 4/2002 | Garrett et al. | 714/763 |
| 6,535,450 B1 * | 3/2003 | Ryan et al. | 365/230.03 |

FOREIGN PATENT DOCUMENTS

| | | |
|---|---|---|
| JP | 04 222986 | 8/1992 |
| JP | 04 313885 | 11/1992 |
| JP | 05 275657 | 10/1993 |

* cited by examiner

*Primary Examiner*—VanThu Nguyen
(74) *Attorney, Agent, or Firm*—Ladas & Parry

(57) ABSTRACT

A semiconductor memory device using a protocol transmission method, having an improved packet structure comprises a plurality of banks having N subregions which are simultaneously accessed by activation of one row, and a memory control unit capable of accessing a predetermined subregion of the N subregions according to a predetermined field value of packet.

10 Claims, 4 Drawing Sheets

SEMICONDUCTOR MEMORY DEVICE USING A PROTOCOL TRANSMISSION METHOD

BACKGROUND OF THE INVENTION

1. Field of the Invention

The present invention relates generally to a semiconductor memory device, and more particularly, to a dynamic random access memory (hereinafter, referred to as "DRAM") using a protocol transmission method, such as Rambus DRAM.

2. Description of the Related Art

As is well known, DRAM is a device for transmitting and receiving digital signals through a bus at a signal received from a central processing unit (CPU). Therefore, it is useless if bus transmission operations are not performed in the DRAM. However, DRAM interface has become a focus of efforts to optimize electric signal transmission by the DRAM, such as the data width of DRAM and the driving force of data output buffer. That is, research and development efforts have been focused on rapid and accurate signal transmission to the outside by the CPU. However, "data transmission" is more important than "bit transmission". Therefore, it is a more efficient method to transmit data unit having a predetermined size (packet) than to transmit a bit unit signal.

As the paradigm is changed from "bit transmission" processing into "data transmission" processing, Rambus DRAM technology has been developed, using a protocol transmission method. The Rambus DRAM technology employs a method of accessing both DQA and DQB positions in order to rapidly perform data write operations on a memory cell array and data read operations from a memory cell array. That is, first, both DQA and DQB positions of a bank, accessed through a row path such as a row decoder, are activated by a row packet and then, data write and read of DQA and DQB positions are performed through a column path, such as a column decoder, by column packets.

It is necessary to access both DQA and DQB in order to write and read data in certain circumstances. However, there are cases in which either DQA or DQB is selected to write and read necessary data thereon. In that case, according to conventional methods, word lines of DQA and DQB are simultaneously accessed by row packet, and column paths of both DQA and DQB are accessed by column packet, thereby increasing power consumption, as is shown in FIG. 1. Therefore, a method has been proposed so that the data write operation is performed on a core by masking in order to access the data necessary for data write operations. However, the method also has a problem of high power consumption, since both row path and column path of the accessed bank require access of the DQA and DQB.

SUMMARY OF THE INVENTION

Therefore, the present invention has been made to solve the above-mentioned problems and an object of the present invention is to provide a semiconductor memory device using a protocol transmission method capable of reducing power consumption.

Another object of the present invention is to provide a Rambus DRAM capable of accessing either DQA or DQB.

In order to accomplish the above objects, the present invention comprises a plurality of banks having N subregions, which are simultaneously accessed by activation of one row, and a memory control unit capable of accessing predetermined subregions of the N subregions according to a predetermined field value of a packet.

The banks comprise two subregions, a first subregion and a second subregion, respectively, and it is desirable that either the first subregion or the second subregion or both the first and the second subregions are selectively accessed according to the field value.

In particular, the present invention can be applied to a Rambus DRAM, having DQA and DQB as subregions. In the Rambus DRAM, reserved bits, such as ROWA, ROWR, COLC and COLM packets, are employed to indicate selectively accessed subregions.

As described above, the reserved bits of conventional packet are employed to separately and independently indicate when only DQA or DQB is selectively accessed or both DQA and DQB are accessed. Therefore, it is possible to access only one part of a memory bank in a row operation or in a column operation, thereby reducing the power consumption of a memory.

DETAILED DESCRIPTION OF THE INVENTION

The above objects, and other features and advantages of the present invention will become more apparent after reading the following detailed description when taken in conjunction with the drawings.

Figure 1:
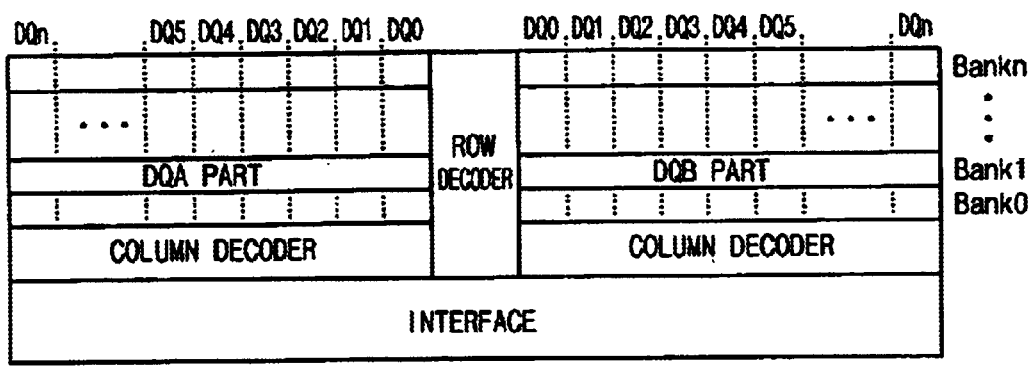
FIG. 1 is a drawing for showing a conventional memory core region.
Figure 2:
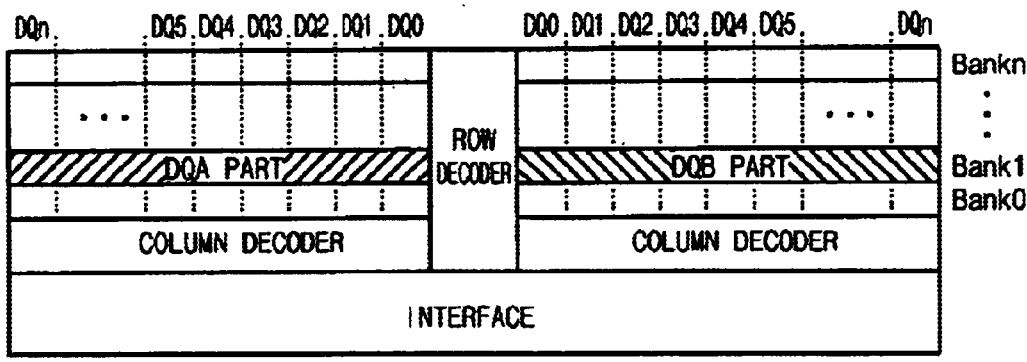
FIG. 2 is a drawing for showing a memory core region according to the present invention.

FIG. 2 is a drawing for showing a memory core region according to the present invention. FIG. 2 is different from FIG. 1 in that each of DQA and DQB are indicated with different hatching lines, that is ones oriented in different directions, in order to indicate that it is possible to separately access either DQA or DQB.

Figure 3:
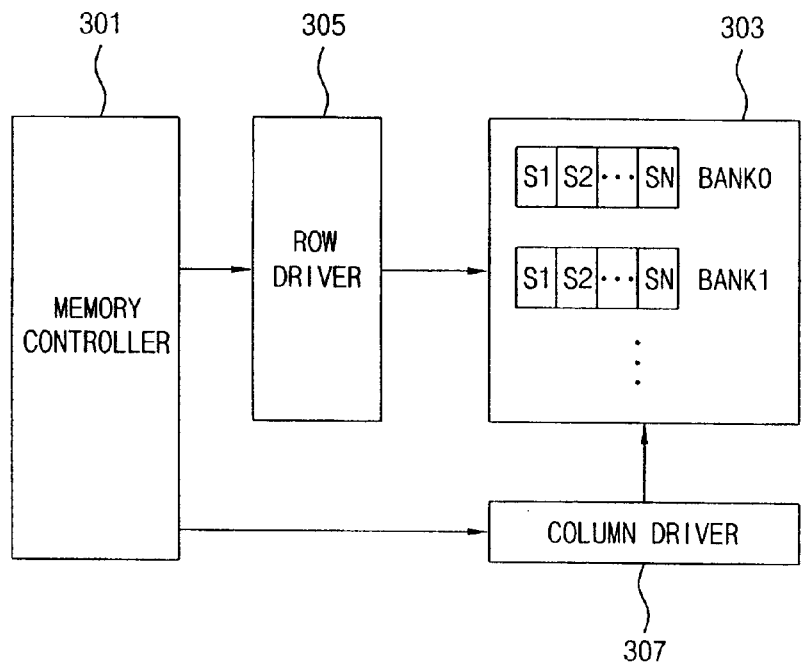
FIG. 3 is a block diagram of a memory to which the present invention is applied.

FIG. 3 is a block diagram of memory to which the present invention is applied. Referring to FIG. 3, a memory generally comprises a memory control unit 301 for controlling general operation of a memory, a bank unit 303, including a memory cell array for practically storing data, a row driving unit 305 for performing row operation of the memory and a column driving unit 307 for performing column operation of the memory. FIG. 3 shows the case when one bank comprises N subregions, S1, S2, . . . SN. However, in a conventional Rambus DRAM, one bank comprises two subregions of DQA and DQB.

Figure 4:
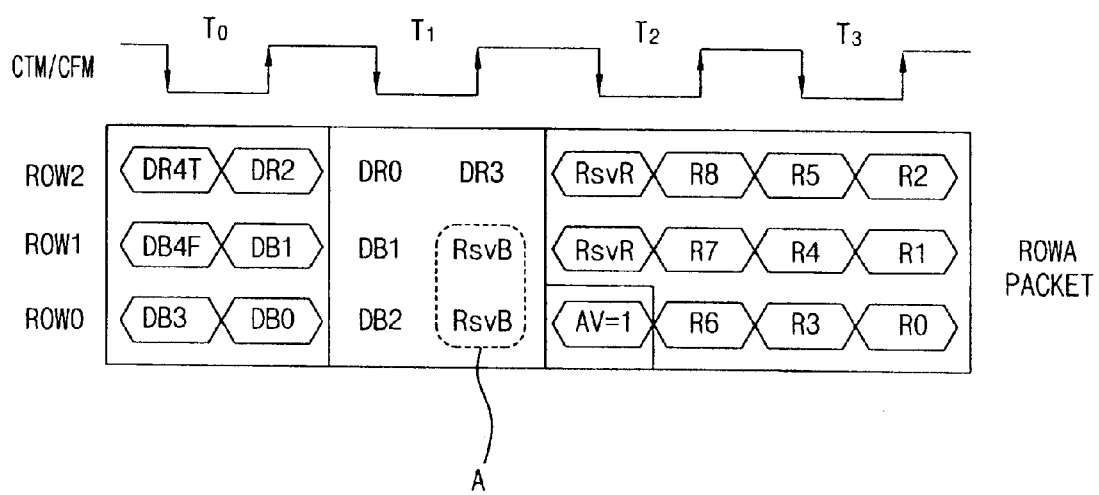
FIG. 4 is a drawing for showing a ROWA packet according to an embodiment of the present invention.

FIG. 4 is a drawing for showing a ROWA packet according to the present invention. The ROWA packet has been employed in conventional Rambus DRAMs. In FIG. 4, the part designated "A" indicates reserved bits, which have not been used or defined in conventional ROWA packets. However, these are employed in the present invention to indicate accessed subregions. If the bit of the first row ROW1 is referred to as "A1" and that of the zero row ROW0 as "A2", it is possible to obtain the following table 1, for separate access of DQA and DQB. The combination of Table 1 is one illustration of possible combinations, and it should be kept in mind that it is also possible to employ other combinations.

TABLE 1

| Note | A1 | A2 |
|---|---|---|
| Only DQA selected | 1 | 0 |
| Only DQB selected | 0 | 1 |
| Both DQA and DQB selected | 1 | 1 |

The Rambus DRAM controls data by a packet unit, having a plurality of banks comprising memory cell array for storing data, wherein one bank comprises two subregions of DQA and DQB. According to the ROWA packet of FIG. 4, the memory control unit 301 controls the other elements of memory so that either DQA or DQB or both DQA and DQB are accessed. The row driving unit 305 performs a row operation to the bank under the control of the memory control unit 301.

According to the above ROWA packet, it is possible to perform a ROWA operation, activating either DQA or DQB or both DQA and DQB of the row address of the corresponding bank in a memory controlling data by a packet unit, such as in a Rambus DRAM.

Figure 5:
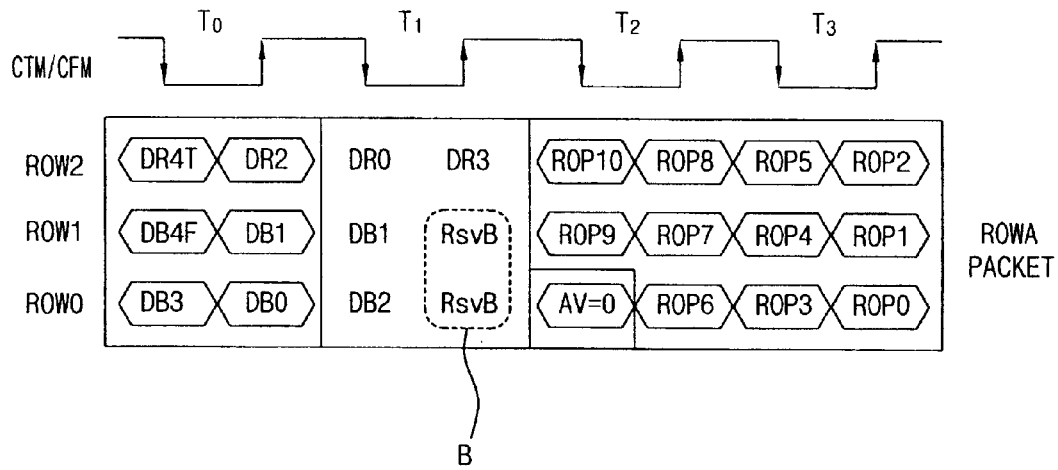
FIG. 5 is a drawing for showing a ROWR packet according to an embodiment of the present invention.

FIG. 5 is a drawing for showing a ROWR packet according to the present invention. In FIG. 5, the part designated "B" indicates reserved bits, which have not been used or defined in conventional ROWR packets. However, these are employed in the present invention to indicate accessed subregion. If the bit of the first row ROW1 is referred to as "B1" and that of the zero row ROW0 as "B2", it is possible to employ the reserved bits B for separate access of DQA and DQB, as shown in the following Table 2.

TABLE 2

| Note | B1 | B2 |
|---|---|---|
| Only DQA selected | 1 | 0 |
| Only DQB selected | 0 | 1 |
| Both DQA and DQB selected | 1 | 1 |

It is possible to selectively access either DQA or DQB or both DQA and DQB of a control signal of a row path in a memory controlling data by a packet unit, such as a Rambus DRAM, by using the ROWR packet and then to perform a ROWR operation, such as precharge, refresh, temperature calibration and power mode change to the corresponding part.

Figure 6:
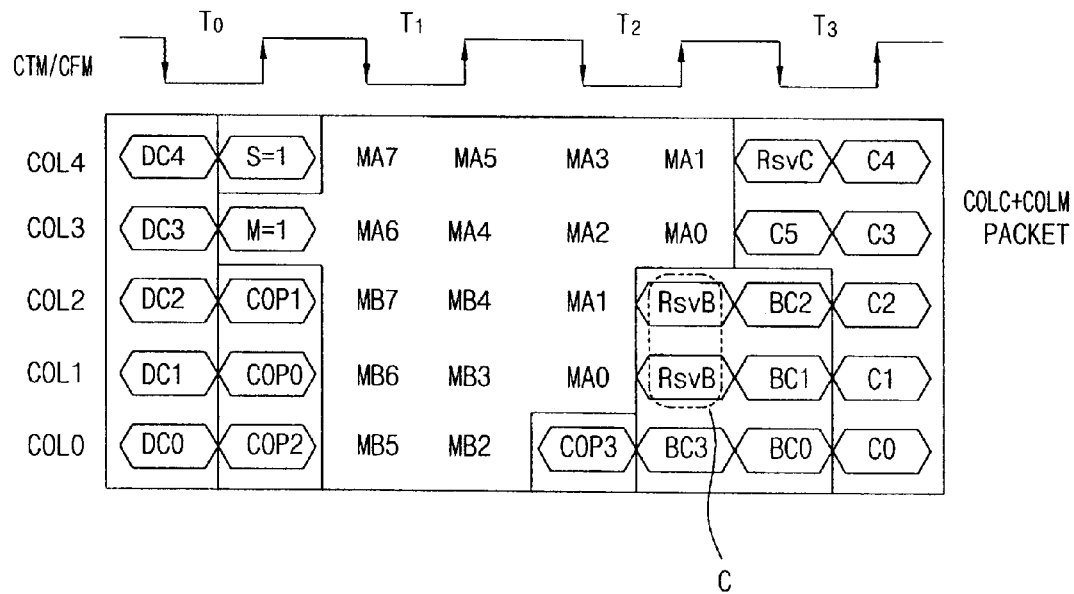
FIG. 6 is a drawing for showing a COLC+COLM packet according to an embodiment of the present invention.

FIG. 6 is a drawing for showing a COLC+COLM packet according to the present invention. In FIG. 6, the part designated "C" indicates reserved bits, which have not been used or defined in conventional COLC+COLM packets. However, these have been employed in the present invention to indicate accessed subregions. If the bit of the second row COL2 is referred to as "C1" and that of the first row COL1 as "C2", it is possible to obtain the following table 3, for separate access of DQA and DQB.

TABLE 3

| Note | C1 | C2 |
|---|---|---|
| Only DQA selected | 1 | 0 |
| Only DQB selected | 0 | 1 |
| Both DQA and DQB selected | 1 | 1 |

It is possible to selectively access either DQA or DQB or both DQA and DQB in a memory controlling data by packet units, such as a Rambus DRAM, by using the COLC+COLM packet and then to perform a column operation such as NoOP, write, read, recharge and current calibration to the corresponding part.

Figure 7:
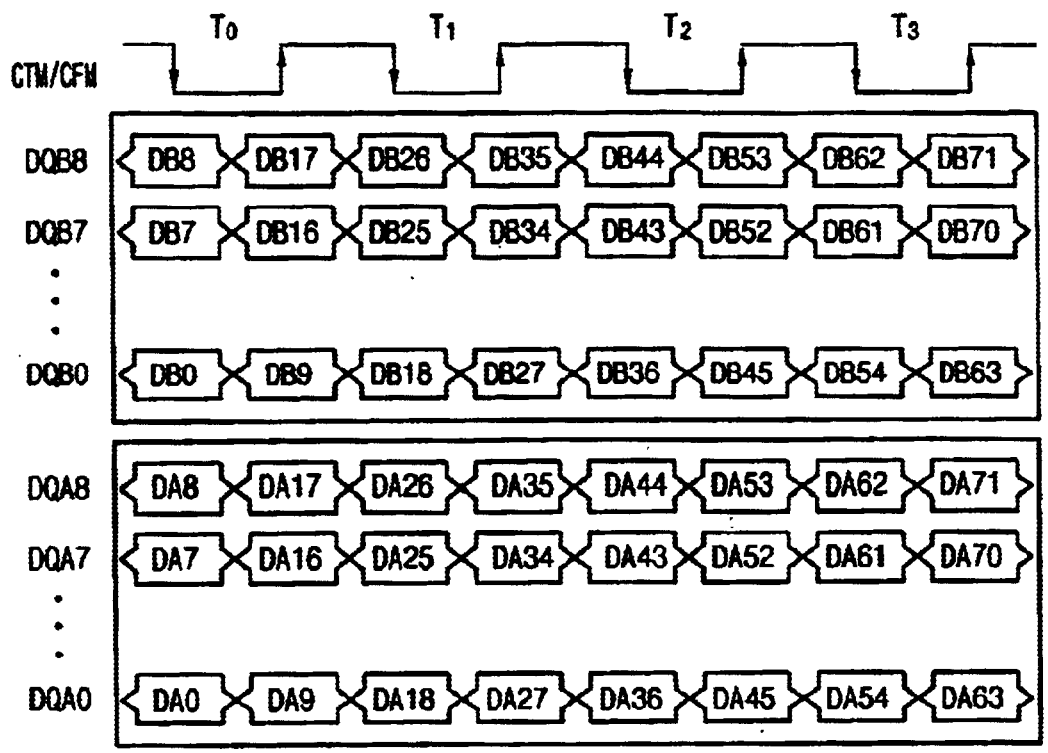
FIG. 7 is a drawing for showing a conventional data packet format.
Figure 8:
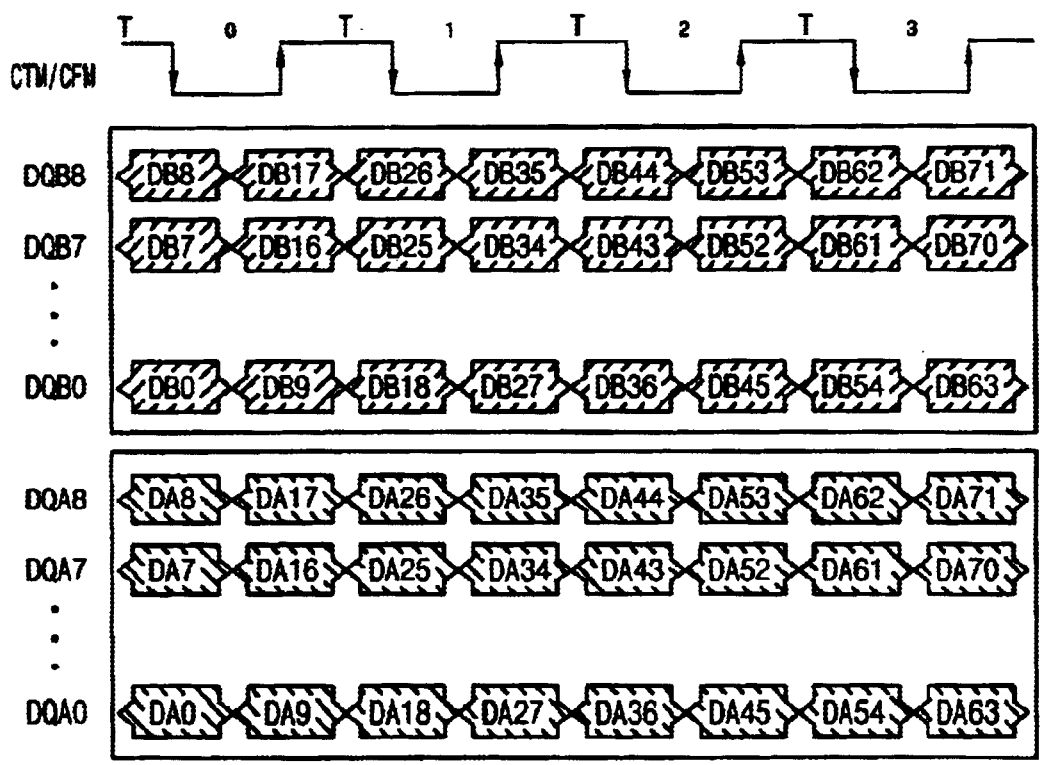
FIG. 8 is a drawing for showing a data packet formation according to an embodiment of the present invention.

FIG. 7 is a drawing showing a conventional data packet format and FIG. 8 is a drawing showing a data packet format according to the present invention. Referring now to FIG. 8, DQA and DQB are indicated with different hatching lines, that is ones oriented in different directions, in order to indicate that it is possible to separately access either DQA or DQB. According to the data packet format, it is possible to input and output data of either DA or DB or both DA and DB, thereby reducing power consumption of data path. In the above description, the present invention has been applied to a Rambus DRAM, wherein one bank comprises two parts of DQA and DQB. However, it is also possible that the present invention may be applicable to a general memory, wherein one bank comprises N subregions and data are controlled by a packet unit. It is also possible to employ other reserved bits in FIGS. 4 and 5 and to employ other combinations to indicate selective access to subregions, such as those shown in Tables 1 to 3.

As described above, according to the present invention, it is possible to perform row operations and column operations to subregions of one bank, in a memory controlling data by packet units, such as a Rambus DRAM. Therefore, it is unnecessary to access all banks, thereby reducing power consumption.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A semiconductor memory device using a protocol transmission method comprising:

a plurality of banks, each bank having N subregions, wherein said N subregions are simultaneously accessed by activation of one row of banks; and a memory control unit capable of accessing a subregion of the N subregions according to a predetermined field value of a packet, wherein each of the plurality of banks comprises N subregions, wherein N is equal to two, a first subregion and a second subregion, respectively, and either the first subregion or the second subregion or both the first and the second subregions are selectively accessed according to the field value of the packet.

2. The semiconductor memory device according to claim 1, wherein the semiconductor memory device is a Rambus DRAM, the first subregion is DQA and the second subregion is DQB.

3. The semiconductor memory device according to claim 2, wherein the packet is a ROWA packet and the field comprises reserved bits of the ROWA packet.

4. The semiconductor memory device according to claim 2, wherein the packet is a ROWR packet and the field comprises reserved bits of the ROWR packet.

5. The semiconductor memory device according to claim 2, wherein the packet is a COLC packet and the field comprises reserved bits of the COLC packet.

6. A semiconductor memory device according to claim 2, wherein the packet is a COLM packet and the field comprises reserved bits of the COLM packet.

7. A Rambus DRAM comprising:
   a plurality of banks each bank comprising row having DQA and DQB subregions, and wherein each row of DOA and DOB subregions is simultaneously accessed by activation of one row of banks; and
   a memory control unit capable of accessing one subregion of the two subregions according to a predetermined field value of a packet, wherein the packet is a ROWA packet and the field comprises reserved bits of the ROWA packet.

8. The Rambus DRAM according to claim 7, wherein the packet is a ROWR packet and the field comprises reserved bits of the ROWR packet.

9. The Rambus DRAM according to claim 7, wherein the packet is a COLC packet and the field comprises reserved bits of the COLC packet.

10. The Rambus DRAM according to claim 7, wherein the packet is a COLM packet and the field comprises reserved bits of the COLM packet.

* * * * *